US 8,638,829 B2

(12) United States Patent
Maeda et al.

(10) Patent No.: US 8,638,829 B2
(45) Date of Patent: Jan. 28, 2014

(54) SEMICONDUCTOR LASER

(75) Inventors: Osamu Maeda, Kanagawa (JP);
Takehiro Taniguchi, Tokyo (JP);
Takahiro Arakida, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 12/661,067

(22) Filed: Mar. 10, 2010

(65) Prior Publication Data

US 2010/0238965 A1 Sep. 23, 2010

(30) Foreign Application Priority Data

Mar. 23, 2009 (JP) ................ P2009-070228
Apr. 1, 2009 (JP) ................ P2009-089306

(51) Int. Cl.
*H01S 5/183* (2006.01)
*H01S 5/343* (2006.01)
(52) U.S. Cl.
USPC .......... 372/45.012; 372/45.011; 372/46.01; 372/46.013; 372/50.11; 372/50.124
(58) Field of Classification Search
USPC ........... 372/45.01, 45.012, 46.01, 46.013, 372/50.11, 50.124
See application file for complete search history.

(56) References Cited

U.S. PATENT DOCUMENTS

| | | | |
|---|---|---|---|
| 5,513,202 A * | 4/1996 | Kobayashi et al. | 372/96 |
| 7,359,421 B2 | 4/2008 | Brenner et al. | |
| 2009/0129417 A1* | 5/2009 | Maeda et al. | 372/44.01 |

FOREIGN PATENT DOCUMENTS

JP 2008-016824 A 1/2008

OTHER PUBLICATIONS

"High Output Power 670nm VCSELs", SPIE vol. 6484 Vertical-Cavity Surface-Emitting Lasers XI, paper 6484-04 (5 pages), Copyright 2007.
"Transverse Mode Control in Long-Monolithic-Cavity VCSELs with Temperature-Profile Control", Electronics Letters Jan. 19, 2006, vol. 42, Issue 2, p. 94-96.

* cited by examiner

*Primary Examiner* — Jessica Stultz
*Assistant Examiner* — Michael Carter
(74) *Attorney, Agent, or Firm* — Lerner, David, Littenberg, Krumholz & Mentlik, LLP

(57) ABSTRACT

A semiconductor laser includes a columnar lamination structure including a first multi-layer reflection mirror, a first spacer layer, an $Al_xGa_yIn_{1-x-y}P$ (where $0 \leq x < 1$ and $0 < y < 1$) based active layer, a second spacer layer, a second multi-layer reflection mirror, and a lateral mode adjusting layer on a substrate in this order from the substrate and including a current narrowing layer. The current narrowing layer includes an unoxidized region in an in-plane central region and a circular oxidized region in the circumference of the unoxidized region. The later mode adjusting layer includes a high reflection region to correspond to the unoxidized region and a circular low reflection region in the circumference of the high reflection region. On the assumption that a diameter of the unoxidized region is $D_{ox}$ and a diameter of the high reflection region is $D_{hr}$, the diameters $D_{ox}$ and $D_{hr}$ satisfy an expression of $0.8 < D_{hr}/D_{ox} < 1.5$.

5 Claims, 8 Drawing Sheets $L_1 = \lambda$
$L_2 = \frac{7}{4}\lambda$

SEMICONDUCTOR LASER

CROSS-REFERENCE TO RELATED APPLICATIONS

The present application claims priority from Japanese Patent Application No. JP 2009-070228 filed in the Japanese Patent Office on Mar. 23, 2009 and Japanese Patent Application No. JP 2009-089306 filed in the Japanese Patent Office on Apr. 1, 2009, the entire contents of both are incorporated herein by reference.

BACKGROUND OF THE INVENTION

1. Field of the Invention

The present invention relates to a surface-emitting semiconductor laser capable of emitting a laser beam from the surface thereof, and particularly, to a surface-emitting semiconductor laser appropriately applicable to a case where single-mode optical output is necessary.

2. Description of the Related Art

In the surface-emitting semiconductor laser emitting light in a direction perpendicular to a substrate, a plurality of elements can be arrayed on the same substrate in a two-dimensional shape. For example, when a surface-emitting semiconductor laser arrayed in a two-dimensional shape is used as a light source for digital copy apparatuses or printers, pixel information can be input onto a photoconductive drum in a parallel process, thereby achieving high density and high speed. Accordingly, the surface-emitting semiconductor laser has recently been used as the light source of digital copy apparatuses or printers.

The surface-emitting semiconductor laser used as the light source of printers has been commercialized by several makers. However, the wavelength band is restricted to an infrared band (770 nm to 790 nm). When the oscillation wavelength can be made to be shorter, a beam spot can be made smaller. Therefore, a high precision printer can be realized. Accordingly, a surface-emitting semiconductor laser of a red band which can be used as the light source of printers has recently been developed.

For example, U.S. Pat. No. 7,359,421 discloses a technique capable of oscillating the surface-emitting semiconductor laser of a red band as a single lateral mode. In U.S. Pat. No. 7,359,421, since current narrowing of an oxidized layer achieves a strong refractive index distribution, it is asserted that the property of the single mode is not excellent. In U.S. Pat. No. 7,359,421, a gain guide structure by ion implantation is used to realize a weak refractive index distribution. Moreover, since the current narrowing layer is formed by two-time ion implantation, a variation in the refractive index is inhibited due to a thermal lensing effect. In U.S. Pat. No. 7,359, 421, it is asserted that single mode oscillation of high output can be achieved since the lateral mode can be controlled by the broad current narrowing. The inventors of U.S. Pat. No. 7,359,421 published a paper (SPIE Vol. 6484 Vertical-Cavity Surface-Emitting Lasers XI, paper 6484-04) about the surface-emitting semiconductor laser of a read band. In SPIE Vol. 6484 Vertical-Cavity Surface-Emitting Lasers XI, paper 6484-04, it is not clear that the configuration of U.S. Pat. No. 7,359,421 is used. However, when it is assumed that the configuration of U.S. Pat. No. 7,359,421 is used, the optical output of the signal mode is reliably achieved with 2.8 mW at the ambient temperature.

SUMMARY OF THE INVENTION

In SPIE Vol. 6484 Vertical-Cavity Surface-Emitting Lasers XI, paper 6484-04, however, a threshold value is high at 2.8 mA and exceeds 3 mA at high temperature (60° C.). The current with this high threshold value is a factor deteriorating reliability. The reason for using a surface-emitting semiconductor laser as the light source for printers is to expect low drooping due to a low threshold value. However, the above-mentioned method in which the low drooping is not expected is not considered to be an optimum method.

Electronics Letters 19 Jan. 2006 Vol. 42 No. 2 introduces a method of making laser oscillation into a single mode by inhibiting the thermal lensing effect. In Electronics Letters 19 Jan. 2006 Vol. 42 No. 2, a gain guide structure is also used. Moreover, in Electronics Letters 19 Jan. 2006 Vol. 42 No. 2, a heating electrode (current source for heating) is used in a part of a mesa. In this way, only the central portion of a current narrowing layer is locally heated, and thus an increase in the refractive index of the central portion is prevented. According to this method, since the temperature distribution of an active layer and the refractive index distribution are close to flatness, the lateral mode can be controlled by broad current narrowing. Therefore, the signal mode oscillation can be obtained. However, when the heating electrode is disposed, the process or mounting becomes complex, and thus it is not considered to be practical in terms of application. Moreover, even though the advantage of making the temperature distribution of the active layer flat, an increase in the temperature of the entire device is avoidable. For this reason, the optical output may be reduced and thus the reliability may deteriorate.

It is desirable to provide a semiconductor laser capable of realizing single mode oscillation of high output with a simple and plain configuration and with current of a low threshold value.

According to an embodiment of the invention, there is provided an $Al_xGa_yIn_{1-x-y}P$ (where $0 \leq x < 1$ and $0 < y < 1$) based active layer. More specifically, a semiconductor laser includes a columnar lamination structure including a first multi-layer reflection mirror, the active layer, a second multi-layer reflection mirror, and a lateral mode adjusting layer on a substrate in this order from the substrate, and includes a current narrowing layer. The current narrowing layer includes an unoxidized region in an in-plane central region and a circular oxidized region in the circumference of the unoxidized region. The lateral mode adjusting layer includes a high reflection region to correspond to the unoxidized region and a circular low reflection region in the circumference of the high reflection region. On the assumption that a diameter of the unoxidized region is $D_{ox}$ and a diameter of the high reflection region is $D_{hr}$, the diameters $D_{ox}$ and $D_{hr}$ satisfy the following expression, $0.8 < D_{hr}/D_{ox} < 1.5$ . . . .

In the semiconductor laser, the active layer may have a quantum well structure formed by alternately laminating well layers mainly containing $Al_aGa_bIn_{1-a-b}P$ (where $0 \leq a < 1$ and $0 < b < 1$) and barrier layers mainly containing $Al_cGa_dIn_{1-c-d}P$ (where $0 < c < 1$ and $0 < d < 1$). The current narrowing layer may be formed in the second multi-layer reflection mirror and may be formed at a position distant from the active layer by $(7/4 + (n/2))\lambda$ (where n is an integer equal to or larger than 0). When the operation temperature is relatively low (for example, about 25° C.), it is preferable that the diameters $D_{ox}$ and $D_{hr}$ satisfy $0.8 < D_{hr}/D_{ox} < 1.0$. When the operation temperature is relatively high (for example, about in the range of 40° C. to about 60° C.), the diameters $D_{ox}$ and $D_{hr}$ preferably satisfy $0.9 < D_{hr}/D_{ox} < 1.1$, and more preferably 1.0 or nearly almost 1.0.

In the semiconductor laser according to the embodiment of the invention, an $Al_xGa_yIn_{1-x-y}P$ (where $0 \leq x < 1$ and $0 < y < 1$) based active layer is formed. That is, the active layer is formed of a material generating light of a red band with a wavelength shorter than that of an infrared band. The semiconductor laser includes the current narrowing layer which includes the unoxidized region in the in-plane central region and the circular oxidized region in the circumference of the unoxidized region. There is provided the lateral mode adjusting layer which includes the high reflection region so as to correspond to the unoxidized region and the circular low reflection region in the circumference of the high reflection region. Moreover, the diameters $D_{ox}$ and $D_{hr}$ satisfy above Expression (1). In this way, the index guide structure of which the equivalent refractive index distribution of the waveguide is weak can be realized.

In the semiconductor laser according to the embodiment of the invention, the diameters $D_{ox}$ and $D_{hr}$ satisfy above Expression (1) in the laser configuration where the active layer is formed of the material generating light of the red band. With such a configuration, the index guide structure of which the equivalent refractive index distribution of the waveguide is weak can be realized. As a consequence, since wattless current can be reduced, compared to a case where the refractive index distribution is realized as a gain guide structure, a low threshold value can be achieved. Moreover, since the lateral mode can be controlled by broad current narrowing, a high output single mode oscillation can be achieved. In the embodiment of the invention, since it is not necessary to use a special structure or a special process, the laser oscillation of the single mode can be achieved with the simple and plain structure. Accordingly, in the embodiment of the invention, a high output single mode oscillation can be achieved with the simple and plain structure and with the current of a low threshold value.

DESCRIPTION OF THE PREFERRED EMBODIMENTS

Figure 1:
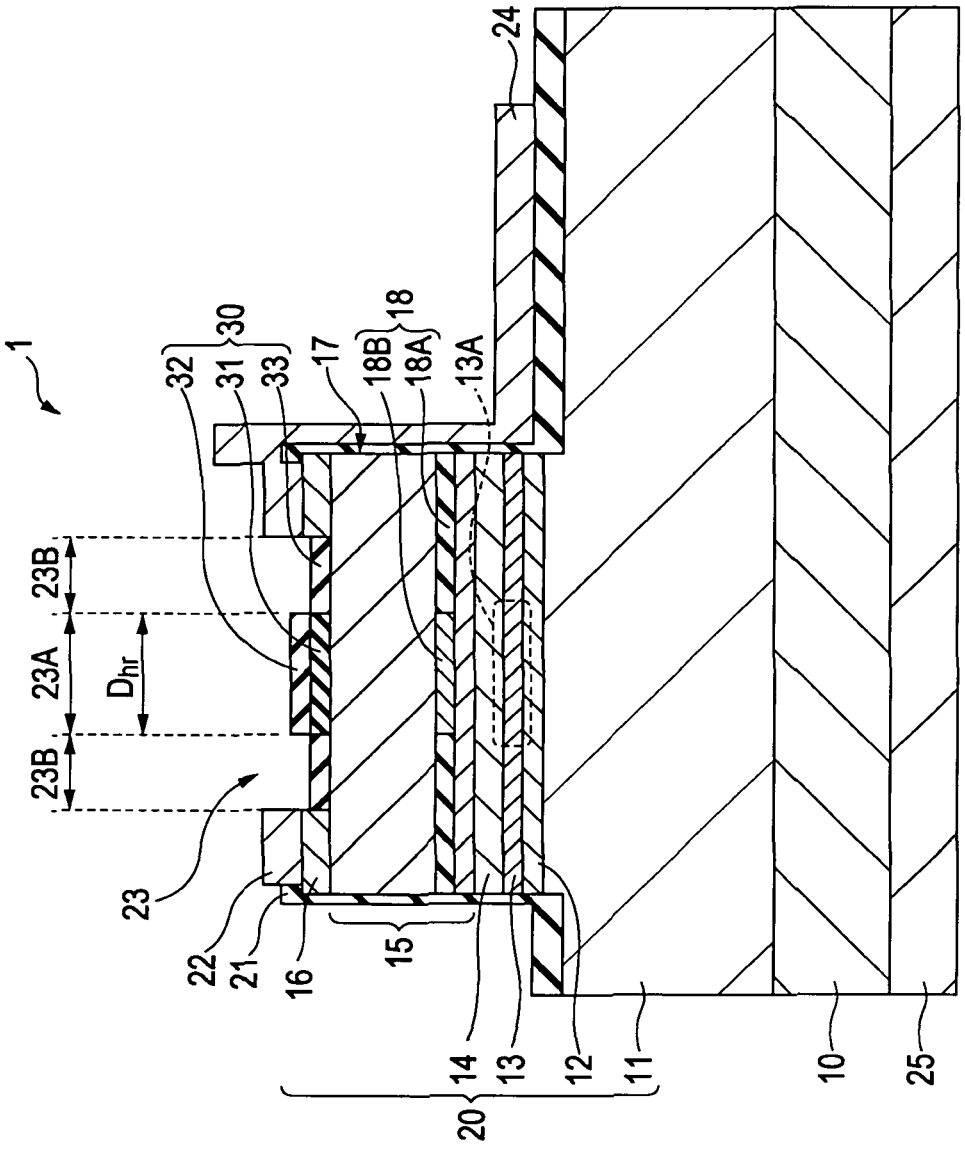
FIG. 1 is a sectional view illustrating a semiconductor laser according to an embodiment of the invention.
Figure 2A:
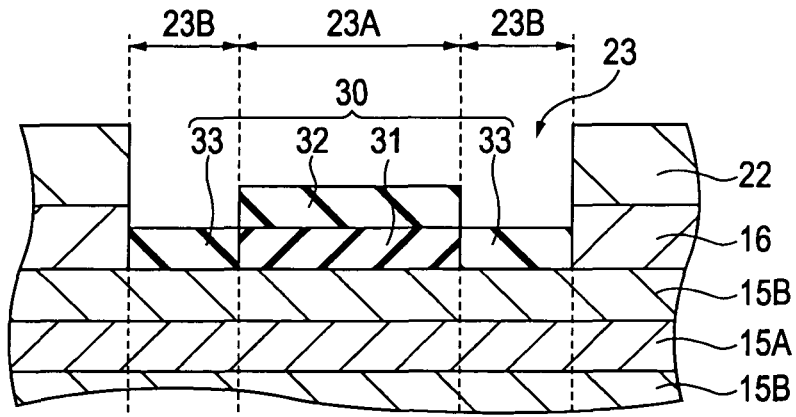
FIG. 2 is an enlarged view illustrating a portion of the semiconductor laser shown in FIG. 1.
Figure 2B:
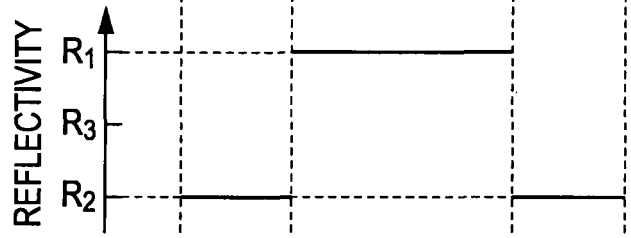

Hereinafter, an embodiment of the invention will be described in detail with reference to the accompanying drawings. The description will be made in the following sequence.
1. Configuration
2. Manufacturing Method
3. Operation Effect
1. Configuration FIG. 1 is a sectional view illustrating the configuration of a surface-emitting semiconductor laser 1 according to an embodiment of the invention. Part (A) of FIG. 2 is an enlarged view illustrating an upper portion of the semiconductor laser 1 shown in FIG. 1. The semiconductor laser 1 has a lamination structure 20 in which a lower DBR layer 11, a lower spacer layer 12, an active layer 13, an upper spacer layer 14, an upper DBR layer 15, and a contact layer 16 are laminated on one surface of a substrate 10 in this order from the substrate 10, for example. A columnar mesa portion 17 with a width of about 20 μm to about 50 μm, for example, is formed in the upper portion of the lamination structure 20, specifically, in a part of the lower DBR layer 11, the lower spacer layer 12, the active layer 13, the upper spacer layer 14, the upper DBR layer 15, and the contact layer 16.

The lower DBR layer 11 corresponds to a specific example of "a first multi-layer film reflection mirror" according to an embodiment of the invention. The upper DBR layer 15 corresponds to a specific example of "a second multi-layer reflection mirror" according to an embodiment of the invention. The lower spacer layer 12 corresponds to a specific example of "a first spacer layer" according to an embodiment of the invention. The upper spacer layer 14 corresponds to a specific example of "a second spacer layer" according to an embodiment of the invention. A lamination structure formed by the lamination structure 20 and the lateral mode adjusting layer 30 corresponds to a specific example of "a lamination structure" according to an embodiment of the invention.

The substrate 10 is formed of n-type GaAs, for example. Examples of an n-type impurity include silicon (Si) or selenium (Se). The lower DBR layer 11 is formed by alternately laminating low refractive index layers (not shown) and high refractive index layers (not shown). The uppermost layer of the lower DBR layer 11 is the high refractive index layer, for example. The low refractive index layer is formed of an n-type $Al_eGa_{1-e}As$ (where $0<e<1$) with an optical thickness of $\lambda/4$ (where $\lambda$ is an oscillation wavelength), for example. The high refractive index layer is formed of an n-type $Al_fGa_{1-f}As$ (where $0<f<1$) with an optical thickness of $\lambda/4$ (where $\lambda$ is an oscillation wavelength), for example.

The lower spacer layer 12 is formed of $Al_gGa_hIn_{1-g-h}P$ (where $0<g<1$ and $0<h<1$), for example. The active layer 13 is formed of an $Al_xGa_yIn_{1-x-y}P$ (where $0\leq x<1$ and $0<y<1$) based compound semiconductor. That is, in the semiconductor laser 1 according to this embodiment, the active layer 13 is formed of a material generating light of a red band with a wavelength shorter than that of an infrared band. Moreover, the $Al_xGa_yIn_{1-x-y}P$ based compound semiconductor refers to a compound semiconductor containing at least Ga, In, and As among Al, Ga, and In.

The active layer 13 has a quantum well structure formed by alternately laminating well layers (not shown) mainly containing $Al_aGa_bIn_{1-a-b}P$ (where $0\leq a<1$ and $0<b<1$) and barrier layers (not shown) mainly containing $Al_cGa_dIn_{1-c-d}P$ (where $0<c<1$ and $0<d<1$). In the active layer 13, a region facing an unoxidized area 18B, which is described below, becomes a light-emitting region 13A. The light-emitting region 13A corresponds to a current injection region to which current narrowed in the current narrowing layer 18, which is described below, is injected. The light-emitting region 13A is a region where basic lateral mode oscillation mainly occurs. A circular circumferential region surrounding the light-emitting region 13A serves as a region where high-order lateral mode oscillation mainly occurs.

The upper spacer layer 14 is formed of $Al_jGa_kIn_{1-j-k}P$ (where $0<j<1$ and $0<k<1$), for example. The lower spacer layer 12, the active layer 13, and the upper spacer layer 14 preferably contain no impurity, but may contain p-type or n-type impurity. Examples of the p-type impurity include zinc (Zn), magnesium (Mg), and beryllium (Be).

Here, a cavity length $L_1$ (which is a distance between the central portion of the active layer 13 in the thickness direction thereof and the surface of the upper spacer layer 14) on the side of the upper DBR layer 15 of the lamination structure 20 is set to $(1/2)\lambda$ or $(1+(m/2))\lambda$ (where m is an integer equal to or larger than 0 and $\lambda$ is an oscillation wavelength), for example. Occurrence of carrier overflow can be further reduced in the cavity length $L_1$ of $(1+(m/2))\lambda$ than in the cavity length $L_1$ of $(1/2)\lambda$. Moreover, as the cavity length $L_1$ is larger, a distance $L_2$ of the current narrowing layer 18, which is described below, becomes necessarily distant from the active layer 13. Therefore, it is possible to realize an index guide structure of which an equivalent refractive index distribution of a region (waveguide) propagating light in the lamination structure 20 is weak. However, as the distance $L_2$ of the current narrowing layer 18 is more distant from the active layer 13, lateral leakage current becomes larger. Therefore, it is preferable that the cavity length $L_1$ is $\lambda$ or $(3/2)\lambda$. A cavity length (which is a distance between the central portion of the active layer 13 in the thickness direction thereof and the lower surface of the lower spacer layer 12) on the lower DBR layer 11 in the lamination structure 20 is set to $(1/2)\lambda$, for example.

The upper DBR layer 15 is formed by alternately laminating a low refractive index layer 15A and high refractive index layers 15B, for example, as shown in FIG. 2. The uppermost layer of the upper DBR layer 15 is the high refractive index layer 15B, for example, and the lowermost layer of the DBR layer 15 is also the high refractive index layer 15B, for example. Here, the low refractive index layer 15A is formed of a p-type $Al_pGa_{1-p}As$ (where $0<p<1$) with a thickness of $\lambda/4$, for example. The high refractive index layer 15B is formed of a p-type $Al_qGa_{1-q}As$ (where $0<q<1$) with a thickness of $\lambda/4$, for example.

In the upper DBR layer 15, however, instead of the low refractive index layer 15A, the current narrowing layer 18 is formed in a part of the lower refractive index layer 15A distant by a predetermined distance from the active layer 13. In the current narrowing layer 18, the in-plane central portion is the unoxidized region 18B and the circular circumferential region surrounding the unoxidized region 18B is an oxidized region 18A. The unoxidized region 18B is formed of a p-type $Al_rGa_{1-r}As$ (where $0<r\leq1$), for example, and thus has a conductive property. On the other hand, the current narrowing region 18A is formed by oxidizing a p-type $Al_rGa_{1-r}As$ layer (an oxidization layer 18D which is described below) from the side surface of the mesa portion 17, for example, and thus has an insulating property. Accordingly, the current narrowing layer 18 has a function of narrowing the current injected from an upper electrode 22 and a lower electrode 25.

It is preferable that the current narrowing layer 18 is formed at a position (a node of a standing wave) distant from the active layer 13 (the central portion of the active layer 13 in the thickness direction thereof) by $(7/4+(n/2))\lambda$ (where n is an integer equal to or larger than 0). As described below, this is because an index guide structure of which the equivalent refractive index distribution of the waveguide is weak is realized. Here, when the cavity length $L_1$ is $\lambda$, the current narrowing layer 18 is formed in a part of a fourth layer (the low refractive index layer 15A) of the active layer 13. Alternatively, when the cavity length $L_1$ is $(3/2)\lambda$, the current narrowing layer 18 is formed in a part of a second layer (the low refractive index layer 15A) of the active layer 13

The contact layer 16 is formed of, for example, p-type GaAs and has a circular opening, for example, in a region facing the unoxidized region 18B.

As shown in FIG. 1 and part (A) of FIG. 2, the lateral mode adjusting layer 30 and the upper electrode 22 are disposed on the upper surface of the mesa portion 17. A protective film 21 is disposed on the side surface and the periphery (base portion) of the mesa portion 17. An electrode pad 24 is disposed on the surface corresponding to the periphery of the mesa portion 17 in the protective film 21. A lower electrode 25 is disposed on the rear surface of the substrate 10.

The lateral mode adjusting layer 30 includes a first adjusting layer 31, a second adjusting layer 32, and a third adjusting layer 33, for example, and is formed in a region (for example, in the opening of the contact layer 16) corresponding to the light-emitting region of the semiconductor laser 1. The first adjusting layer 31 and the second adjusting layer 32 are laminated in this order in the central region of a light exit region, that is, in a region where lateral mode oscillation mainly occurs. Even though not shown, a plurality of the first adjusting layer 31 and a plurality of the second adjusting layer 32 may be laminated as plural pairs of first adjusting layer 31 and second adjusting layer 32. The first adjusting layer 31 and the second adjusting layer 32 are formed so as to correspond to the unoxidized region 18B, as described below. The third adjusting layer 33 is formed in a circular circumferential region surrounding the light exit region, that is, in a region where high-order lateral mode oscillation occurs. The third adjusting layer 33 is formed so as to correspond to the oxidized region 18A, as described below.

Specifically, the first adjusting layer 31 with a thickness of $(2\alpha-1)\lambda/4n_1$ (where $\alpha$ is an integer equal to or larger than 1 and $n_1$ is a refractive index) is formed of a material of which a refractive index $n_1$ is lower than a refractive index of a base layer of the first adjusting layer 31, for example, a dielectric material such as $SiO_2$ (oxide silicon). The base layer of the first adjusting layer 31 is the high refractive index layer 15B disposed on the uppermost surface of the upper DBR layer 15, for example. Specifically, the second adjusting layer 32 with a thickness of $(2\beta-1)\lambda/4n_2$ (where $\beta$ is an integer equal to or larger than 1 and $n_2$ is a refractive index) is formed of a material of which a refractive index $n_2$ is higher than the refractive index of the first adjusting layer 31, for example, a dielectric material such as SiN (silicon nitride). Specifically, the third adjusting layer 33 with a thickness of $(2\gamma-1)\lambda/4n_3$ (where $\gamma$ is an integer equal to or larger than 1 and $n_3$ is a refractive index) is formed of a material of which a refractive index $n_3$ is higher than the refractive index of the first adjusting layer 31, for example, a dielectric material such as SiN (silicon nitride). It is preferable that the second adjusting layer 32 and the third adjusting layer 33 are formed with the same thickness and of the same material. This is because these layers can be manufactured together and thus the manufacturing process can be simplified.

The lamination structure formed by the first adjusting layer 31 and the second adjusting layer 32 acts as reflecting light output from the active layer 13 with high reflectivity. Accordingly, the region where this lamination structure is formed serves as a high reflection region 23A. On the other hand, the third adjusting layer 33 acts as reflecting the light output from the active layer 13 with low reflectivity. Accordingly, the region where the third adjusting layer 33 is formed serves as a low reflection region 23B.

When it is assumed that the reflectivity of the high reflection region 23A is $R_1$, the reflectivity of the low reflection region 23B is $R_2$, and the reflectivity of the region where no adjusting layer is formed in the light exit region is $R_3$, it is preferable that each reflectivity is adjusted so as to satisfy the following relational expression (see the distribution of the reflectivity in Part (B) of FIG. 2 $R_1 \geq R_3 > R_2$.

In this way, only the high-order lateral mode oscillation can be inhibited without reduction in the light output of the basic lateral mode.

For example, when the reflectivity of the first adjusting layer 31 is 1.6 and the reflectivities of the second adjusting layer 32 and the third adjusting layer 33 are 2.0, the reflectivity $R_1$ of the high reflection region 23A is 99.6%, for example, and thus the reflectivity $R_2$ of the low reflection region 23B is 97.2%, for example. In addition, the reflectivity $R_3$ is 99.5%. Therefore, even when the reflectivity is lowered due to a small difference, the gain decreases in the low reflection region 23B. Accordingly, only the high-order lateral mode oscillation can be inhibited without the reduction in the light output of the basic lateral mode.

The protective film 21 made of an oxide material or a nitride material, for example, is formed so as to cover the side surface and the periphery (base portion) of the mesa portion 17. The upper electrode 22 and the electrode pad 24 are formed by laminating Ti, Pt, and Au, for example, in this order and are electrically connected to the contact layer 16. The upper electrode 22 has an opening in the region corresponding to the opening of the contact layer 16. This opening of the upper electrode 22 forms one opening (light-emitting opening 23) together with the opening of the contact layer 16, for example, when viewed from the upper surface of the semiconductor laser 1. The openings of the contact layer and the upper electrode 22 may not have the same inner diameter, but the inner diameter of the upper electrode 22 may be larger than that of the contact layer 16. The lower electrode 25 is formed by laminating an alloy layer of Au and Ge, Ni, and Au, for example, in this order from the lateral portion of the substrate 10 and is electrically connected to the substrate 10.

Figure 3:
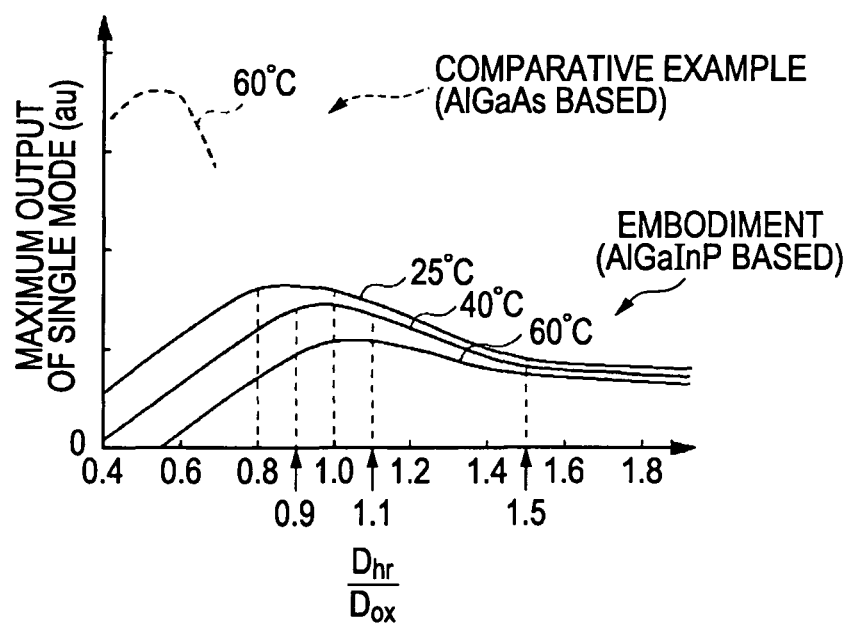
FIG. 3 is a diagram illustrating the characteristics of the maximum output and temperature dependency in a single mode of the semiconductor laser shown in FIG. 1.
Figure 4A:
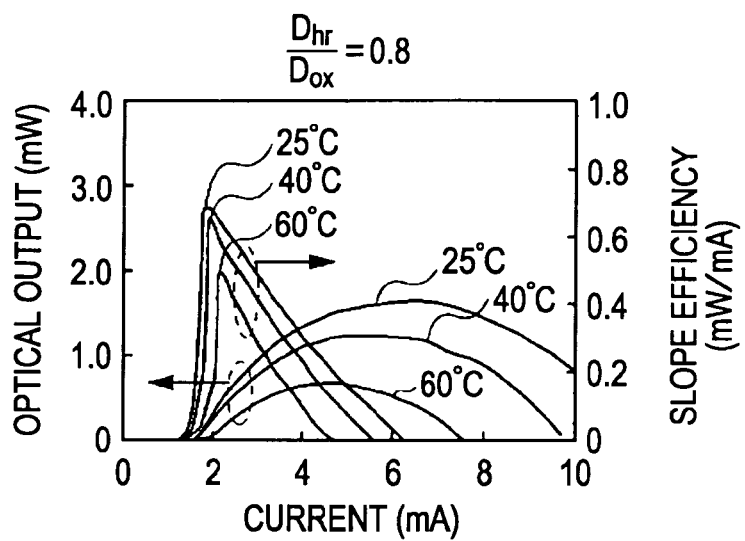
FIGS. 4A to 4C are diagrams illustrating the I-L characteristics and slope efficiency of the semiconductor laser shown in FIG. 1.
Figure 4B:
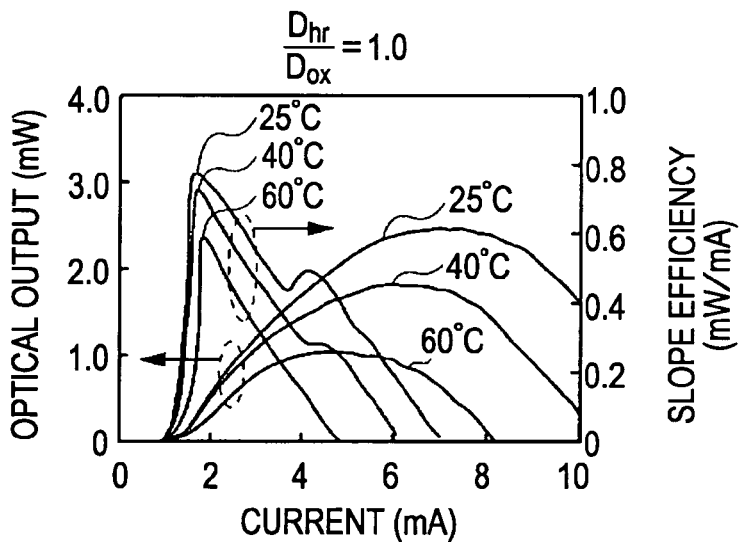
Figure 4C:
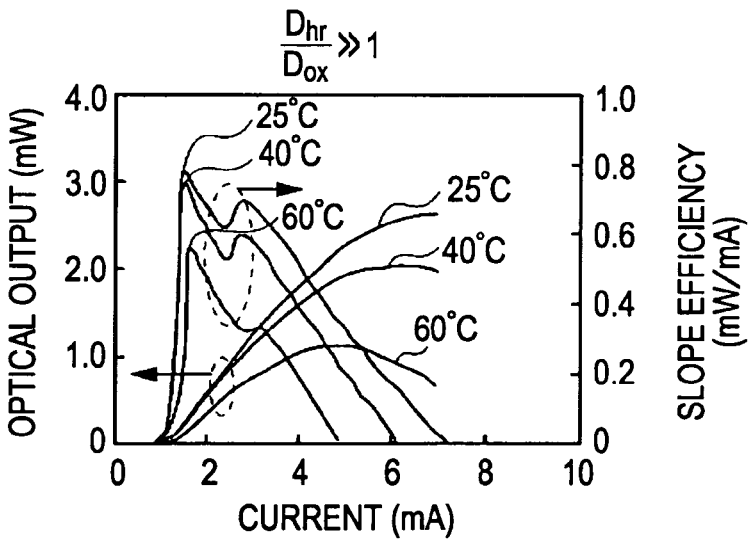

Next, the relationship between a diameter $D_{hr}$ of the high reflection region 23A and an oxidation narrowing diameter $D_{ox}$ (the diameter of the unoxidized region 18B) of the current narrowing layer 18 will be described with reference to FIG. 3 and FIGS. 4A to 4C. FIG. 3 is a diagram illustrating an example of the relationship between $D_{hr}/D_{ox}$ and the maximum output of a single mode. In FIG. 3, the result of the embodiment indicated by a full line is obtained when the current narrowing layer 18 meets the node of a standing wave formed in the lamination structure 20 and is formed at the position (see FIG. 5A described below) distant by $(7/4)\lambda$ from the active layer 13. The position of the current narrowing layer 18 will be described in detail below. In FIG. 3, the result of a comparative example indicated by a dash line is obtained by forming the active layer with an AlGaAs based (infrared-based) material. FIG. 4A is a diagram illustrating an I-L characteristic and an example of slope efficiency (the slope of an I-L curve) in a case of $D_{hr}/D_{ox}=0.8$. FIG. 4B is a diagram illustrating an I-L characteristic and an example of slope efficiency in a case of $D_{hr}/D_{ox}=1.0$. FIG. 4C is a diagram illustrating an I-L characteristic and an example of slope efficiency in a case of $D_{hr}/D_{ox}>1.0$.

As described above, the first adjusting layer 31 and the second adjusting layer 32 (the high reflection region 23A) are formed so as to correspond to the unoxidized region 18B. Specifically, the central axis (not shown) of the high reflection region 23A and the central axis (not shown) of the unoxidized region 18B are located in the same line. Moreover, the diameter $D_{hr}$ of the high reflection region 23A and the diameter $D_{ox}$ of the oxidized region 18B satisfy the following relational expression, $0.8 < D_{hr}/D_{ox} < 1.5 \ldots (1)$.

Here, when the value of $D_{hr}/D_{ox}$ is 0.8, the linearity of the I-L characteristic is poor and the oscillation output is not made large, as in FIG. 4A. Moreover, when the value of $D_{hr}/D_{ox}$ is smaller than 0.8, the linearity of the I-L characteristic is poorer and it is difficult to make oscillation. When the value of $D_{hr}/D_{ox}$ is 1.5, a large inflection point is present in the slope efficiency and thus a high-order mode appears for the output corresponding to the inflection point, as in FIG. 4C. Moreover, when the value of $D_{hr}/D_{ox}$ exceeds 1.5, a high-order mode also appears for the output corresponding to an inflection point. Alternatively, when the value of $D_{hr}/D_{ox}$ is 1.0, the linearity of the I-L characteristic is good, no inflection point where a high-order mode appears is present, and thus the basic lateral mode is stably oscillated, as in FIG. 4B. For this point of view, the above relational expression represents a range in which a high output single mode oscillation is realized with a low threshold value and in a stable manner in a normal temperature condition. Accordingly, when the diameters $D_{ox}$ and $D_{hr}$ satisfy above Expression (1), the single mode oscillation excellent in the temperature characteristic can be realized.

However, when an operation temperature is relatively low (for example, about 25° C.), the diameters $D_{ox}$ and $D_{hr}$ preferably satisfy the relation of $0.8 < D_{hr}/D_{ox} < 1.0$. Alternatively, when the operation temperature is relatively high (for example, in the range of about 40° C. to about 60° C.), the diameters $D_{ox}$ and $D_{hr}$ preferably satisfy the relation of $0.9 < D_{hr}/D_{ox} < 1.1$, and more preferably 1.0 or almost 1.0. When the diameters $D_{ox}$ and $D_{hr}$ satisfy the above relational expression, the maximum output of the single mode can be realized for the above temperature range.

As for the value of $D_{hr}/D_{ox}$, the value of the inner diameter of the light-emitting opening 23 is present as the physical upper limit. This is because that when the value of $D_{hr}/D_{ox}$ is the same the inner diameter of the light-emitting opening 23, the high reflection region 23A is formed in the entire light-emitting opening 23 and no low reflection region 23B is present. When the high reflection region 23A is formed in the entire light-emitting opening 23, the maximum output of the single mode, the I-L characteristic, and the slope efficiency are the same as those in a case where the value of $D_{hr}/D_{ox}$ is sufficiently larger 1. Accordingly, the maximum output of the single mode when the high reflection region 23A is formed in the entire light-emitting opening 23 is the same as the maximum output of the single mode when the value of $D_{hr}/D_{ox}$ is 1.5 or more, for example, in FIG. 3. The I-L characteristic and the slope efficiency when the high reflection region 23A is formed in the entire light-emitting opening 23 are the same as those in FIG. 4C, for example.

In the infrared-based laser according to the comparative example, however, the value of $D_{hr}/D_{ox}$ with which the output of the single mode becomes the maximum is considerably smaller than a range (above Expression (1)) very suitable for the semiconductor laser 1 according to this embodiment. This results from a difference in the material of a laser. That is, in an infrared-based laser, an index guide structure of which the equivalent refractive index distribution of the waveguide is strong is realized. Accordingly, when the diameter $D_{ox}$ is 5 μm or more or less than 10 μm, third-order mode oscillation easily occurs in the light-emitting region. Moreover, the linearity of the I-L characteristic becomes poor, as the diameter $D_{ox}$ is larger in the above range. However, even when the diameter $D_{ox}$ is in the above range, third-order or more mode oscillation can be inhibited by optimizing other conditions. The infrared-based material is better than the red-based material in the temperature characteristic. Therefore, even when the diameter $D_{ox}$ of the current narrowing layer is made smaller to the degree that the heat from the active layer is large, the laser characteristic is rarely changed. Accordingly, from several points of view, it is preferable that the diameter $D_{ox}$ is large than the diameter $D_{ox}$ is small in the infrared-based material. Therefore, by setting the diameter $D_{ox}$ to be smaller than 5 μm, it is possible to inhibit the third-order or mode. As a consequence, in the infrared-based laser, the value of $D_{hr}/D_{ox}$ which is the maximum output of the single mode becomes about 0.5 or less.

On the other hand, in the red-based laser, the index guide structure of which the equivalent refractive index distribution of the waveguide is relatively weak is realized. In this way, when the diameter $D_{ox}$ of the oxidized region 18B is 5 μm or more and less than 10 μm, the distribution where the third-order mode oscillation is not present in the light-emitting region occurs. Alternatively, when the diameter $D_{ox}$ of the oxidized region 18B is 10 μm or more, the distribution where the third-order mode oscillation is present in the light-emitting region occurs. Accordingly, by providing the lateral mode adjusting layer 30 and adjusting the diameter $D_{hr}$ so that the diameters $D_{ox}$, and $D_{hr}$ satisfy above Expression (1), it is possible to prevent the third-order mode oscillation. Therefore, it is possible to obtain the single mode oscillation of the high output.

In the red-based laser, when the diameter $D_{ox}$ of the oxidized region 18B is less than 5 μm, the second order mode may be inhibited, and thus the optical output may deteriorate due to an increase in the heat resistance of the device. For this reason, it is preferable that the diameter $D_{ox}$ of the oxidized region 18B is 5 μm or more. In the red-based laser, when the diameter $D_{ox}$ of the oxidized region 18B is 10 μm or more, as described above, it is difficult to selectively inhibit the third-order mode oscillation. Accordingly, it is preferable that the diameter $D_{ox}$ of the oxidized region 18B is less than 10 μm.

Figure 5A:
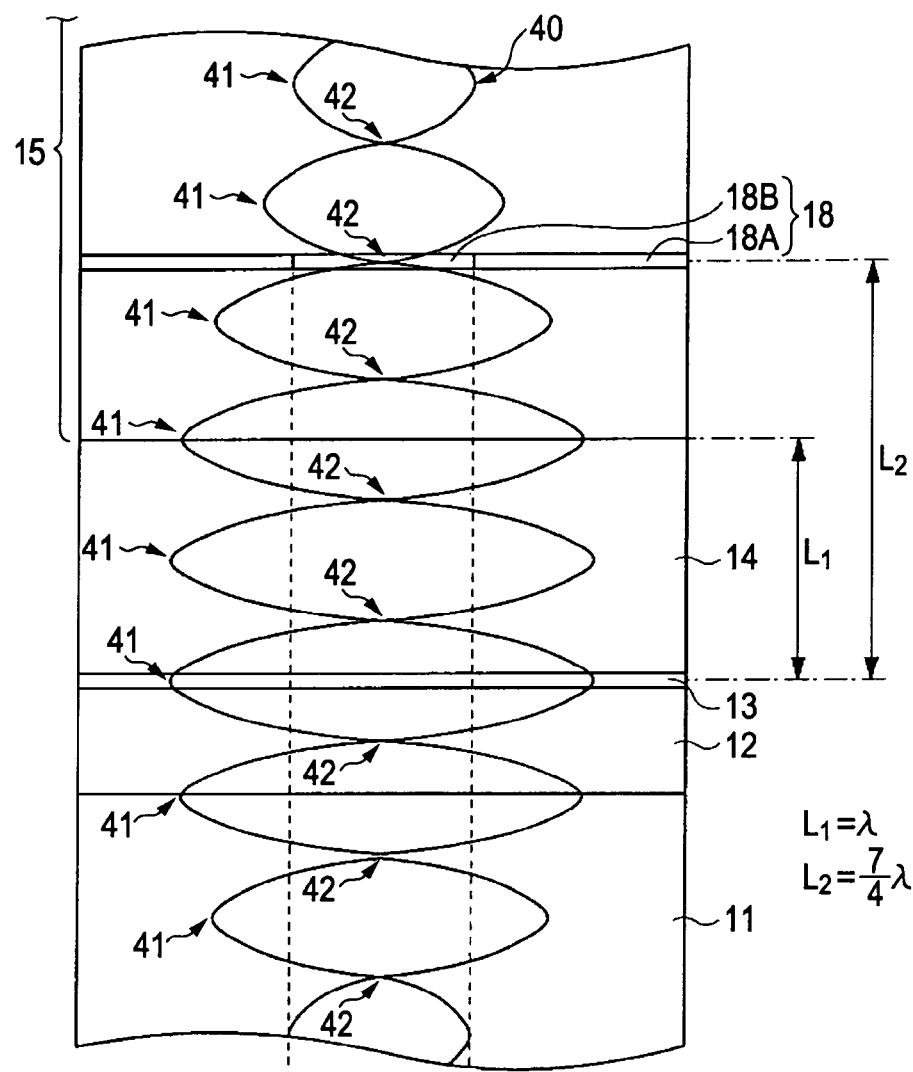
FIGS. 5A and 5B are schematic diagram illustrating a location relation of a standing wave in a current narrowing layer of the semiconductor laser shown in FIG. 1
Figure 5B:
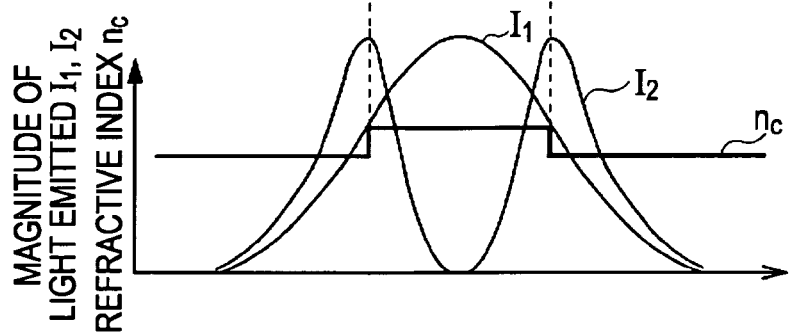
Figure 6A:
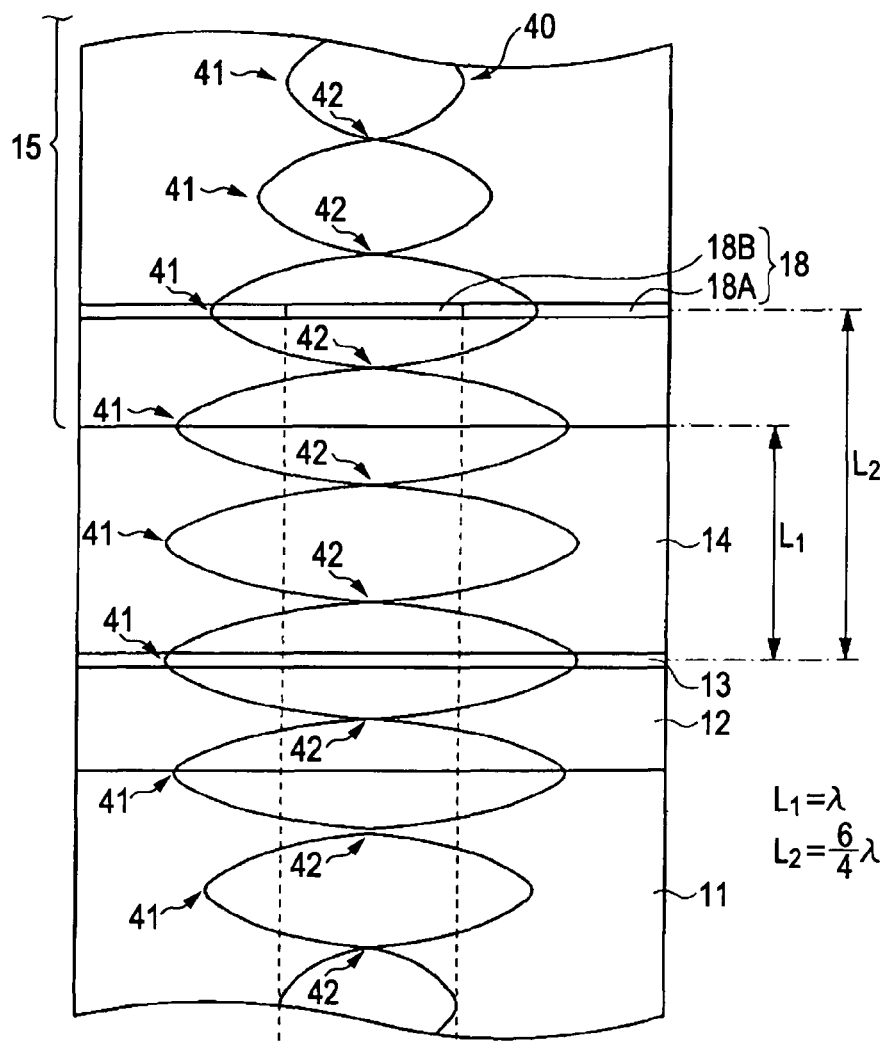
FIGS. 6A and 6B are schematic diagram illustrating a location relation of standing wave in a current narrowing layer of the semiconductor laser according to a comparative example.
Figure 6B:
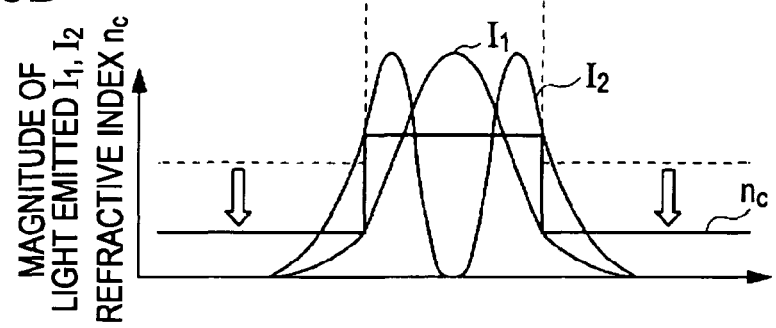

Next, the refractive index distribution suitable for the index guide structure formed in the in-plane direction in the lamination structure 20 will be described with reference to FIGS. 5A and 5B and FIGS. 6A and 6B. FIG. 5A is a schematic diagram illustrating a standing wave 40 generated in the lamination structure 20. FIG. 5B is a diagram illustrating an example of the equivalent refractive index distribution of the waveguide. FIG. 6A is a schematic diagram illustrating the standing wave 40 generated in the lamination structure 20 of the semiconductor laser according to a comparative example. FIG. 6B is a diagram illustrating an example of the equivalent refractive index distribution of the waveguide of the semiconductor laser according to the comparative example. FIGS. 5B and 6B each show the refractive index distribution, light emission brightness $I_1$ of the single mode, and light emission brightness $I_2$ of a second order mode.

In FIGS. 5A and 6A, an anti-node 41 of the standing wave 40 generated in the lamination structure 20 is located at the central portion of the active layer 13 in the thickness direction thereof. In FIGS. 5A and 6A, the cavity length $L_1$ of the upper DBR layer 15 is $(3/2)\lambda$ and the cavity length of the lower DBR layer 11 is $(1/2)\lambda$. In FIG. 5A, the current narrowing layer 18 is disposed in a part (the position of a node 42 of the standing wave 40) of a fourth layer of the upper DBR layer 15 close to the active layer 13. A distance $L_2$ between the current narrowing layer 18 and the active layer 13 is $(7/4)\lambda$. In FIG. 6A, the current narrowing layer 18 is disposed in a part (the position of an anti-node 41 of the standing wave 40) of a third layer of the upper DBR layer 15 close to the active layer 13. A distance $L_2$ between the current narrowing layer 18 and the active layer 13 is $(6/4)\lambda$.

The following facts can be found from the drawings. First, when the current narrowing layer 18 is disposed at the position of the node 42, a weaker index guide structure of which the equivalent refractive index distribution of the waveguide is weaker is realized, compared to the case where the current narrowing layer 18 is disposed at the position of the anti-node 41. This is because when the current narrowing layer 18 is disposed on the position of the anti-node 41, an optical field is influenced by the low refractive index of the oxidized region 18B, the effective refractive index of the upper spacer layer 14 becomes low, the difference of a refractive index between a core portion and a clad portion becomes large. Moreover, this is because when the current narrowing layer 18 is disposed on the position of the node 42, the optical field is rarely influenced by the low refractive index of the oxidized region 18B, the effective refractive index of the upper spacer layer 14 does not become low, the difference between the refractive index of the refractive index of the core portion and the clad portion can be made small.

In FIG. 5A, when the thickness of the current narrowing layer 18 is 30 nm, a value $\Delta n$ ((the refractive index of the core portion—the refractive index of the clad portion)/(the refractive index of the core portion)) obtained by a difference between the refractive index of the core portion and the refractive index of the clad portion by the refractive index of the core portion is less than 0.1%. Alternatively, in FIG. 6A, when the thickness of the current narrowing layer 18 is 30 nm, the value $\Delta n$ is larger than 0.5%. In this embodiment, "the weak index guide structure" refers to an index guide structure having a refractive index distribution in which the $\Delta n$ is less than 0.1%, for example. In this embodiment, "a strong index guide structure" refers to an index guide structure having a refractive index distribution in which the $\Delta n$ is larger than 0.5%, for example.

The magnitude of the standing wave 40 becomes weaker, as the standing wave gets away from the active layer 13. Accordingly, when the current narrowing layer 18 is disposed at the position of the node 42 which is away from the active layer 13, the index guide structure of the refractive index distribution is weaker is realized, compared to a case where the current narrowing layer 18 is disposed at the position of the node 42 which is close to the active layer 13. Accordingly, the index guide structure of which the refractive index distribution is weaker can be realized by disposing the current narrowing layer 18 at the position of the node 42 which is away from the active layer 13. However, it is not preferable that the current narrowing layer 18 is far away from the active layer 13, as the distance $L_2$ between the current narrowing layer 18 and the active layer 13 is larger, in that a lateral leakage current becomes large.

2. Manufacturing Method

The semiconductor laser 1 according to this embodiment can be manufactured by the following method, for example.

FIGS. 7A and 7B to FIGS. 9A and 9B are diagrams illustrating a manufacturing method of the semiconductor laser. FIGS. 7A and 7B and FIGS. 8A and 8B are diagrams illustrating the cross-section of the device taken along the line A-A of FIG. 1 during the manufacturing process.

Here, a compound semiconductor layer is formed on the substrate 10 formed of GaAs by a MOCVD (Metal Organic Chemical Vapor Deposition) method, for example. Examples of the material of a Group III-V compound semiconductor include trimethyl aluminum (TMA), trimethyl gallium (TMG), trimethyl indium (TMIn), phosphine ($PH_3$), and arsine ($AsH_3$). For example, $H_2Se$ is used as a material of a donor impurity. For example, dimethyl zinc (DMZ) is used as a material of an acceptor impurity.

Figure 7A:
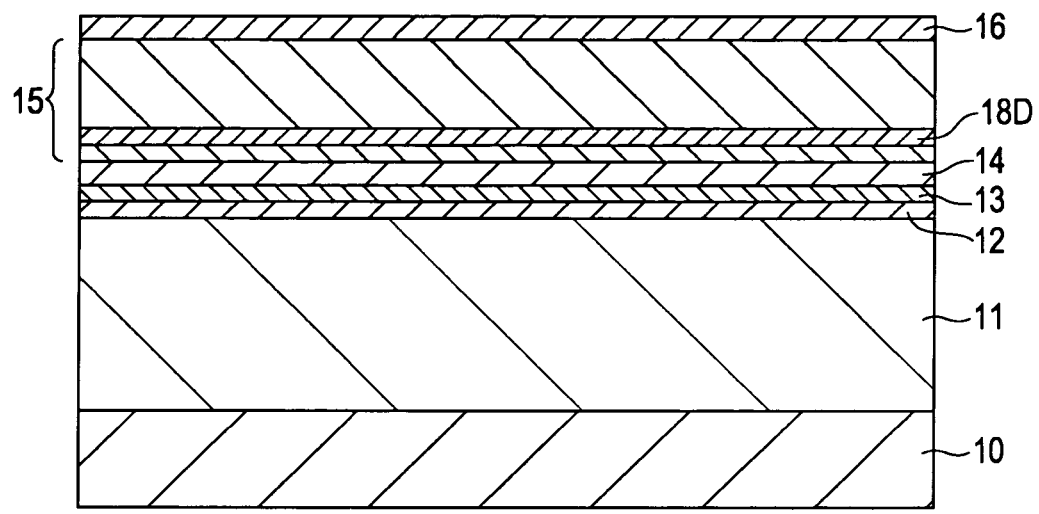
FIGS. 7A and 7B are sectional views illustrating a process of manufacturing the semiconductor laser shown in FIG. 1
Figure 7B:
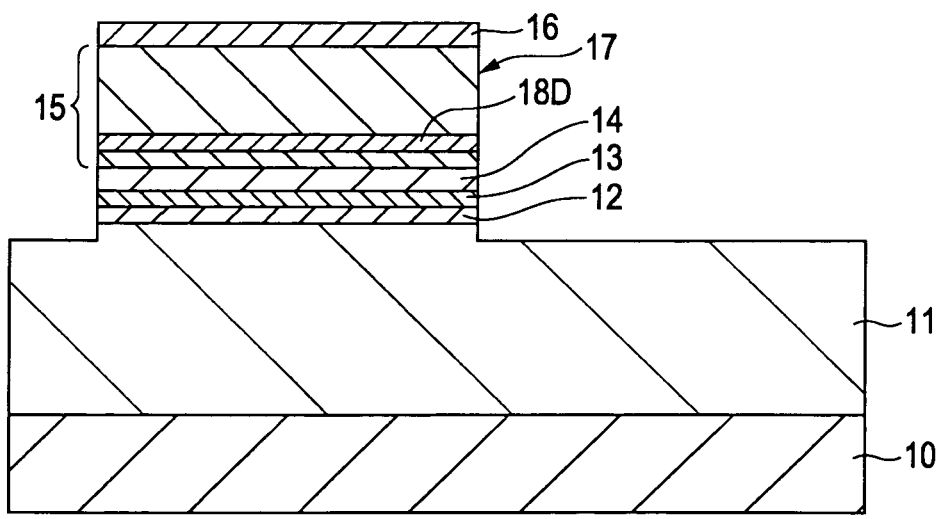
Figure 8A:
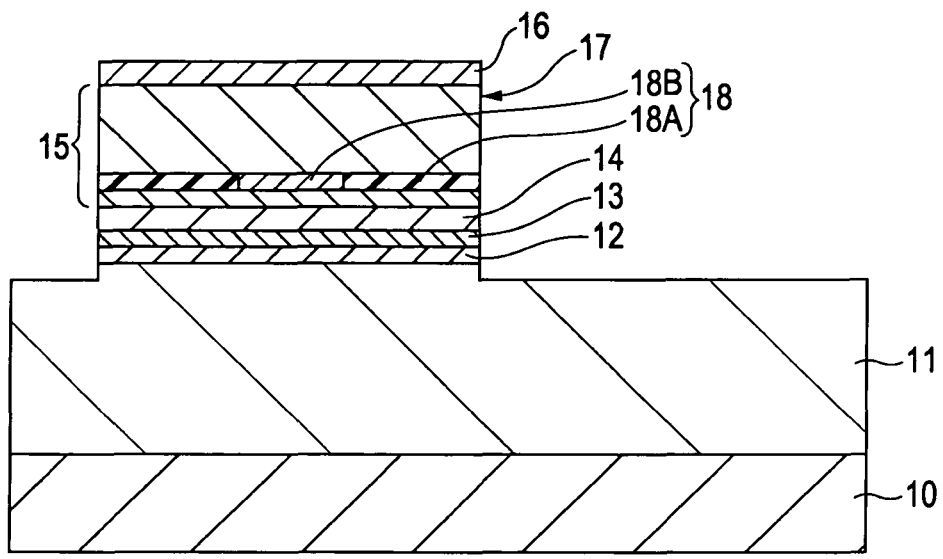
FIGS. 8A and 8B are sectional views illustrating the process of manufacturing the semiconductor laser in FIGS. 7A and 7B.
Figure 8B:
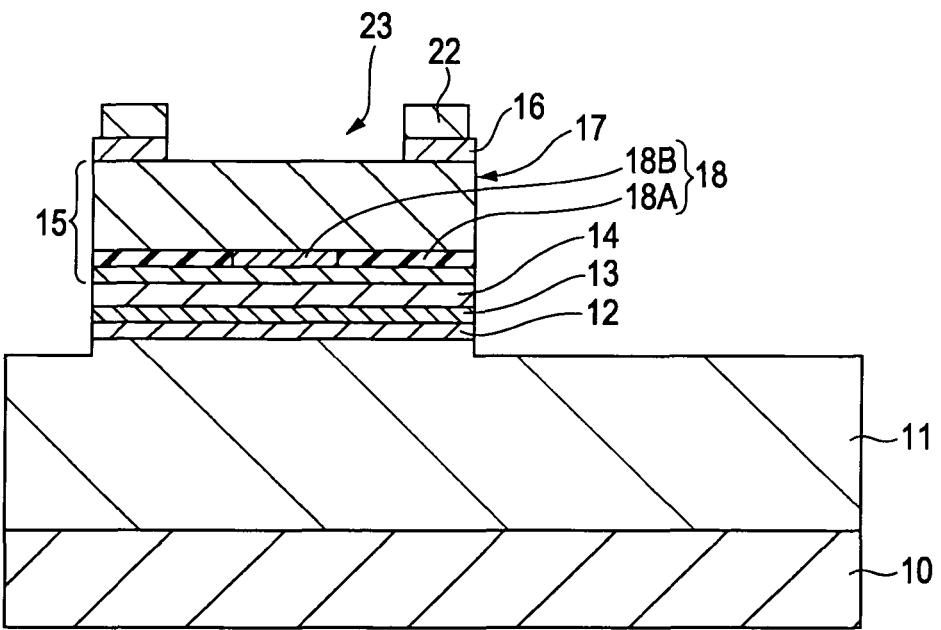
Figure 9A:
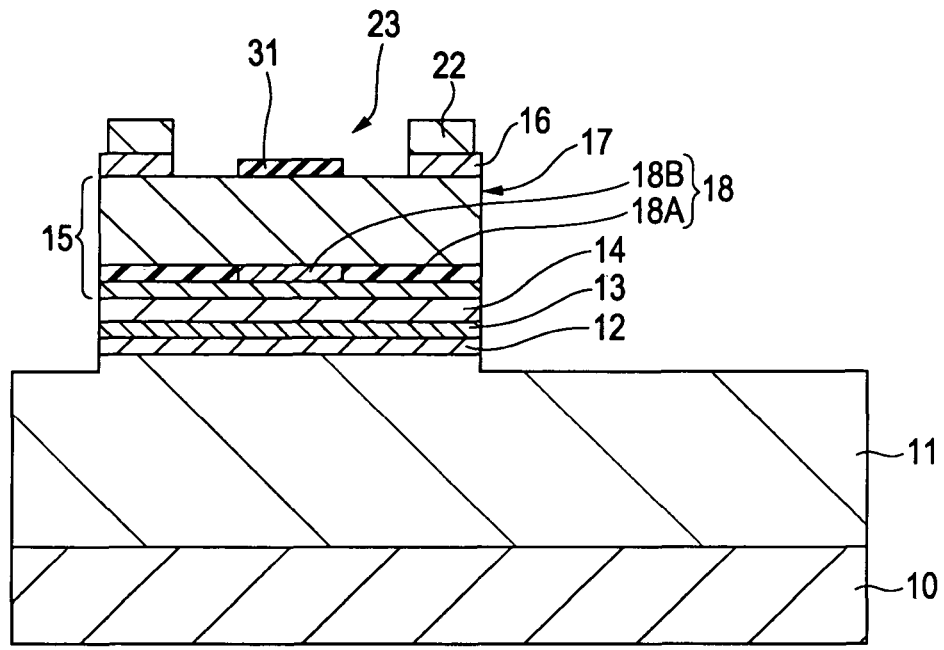
FIGS. 9A and 9B are sectional views illustrating the process of manufacturing the semiconductor laser in FIGS. 8A and 8B.
Figure 9B:
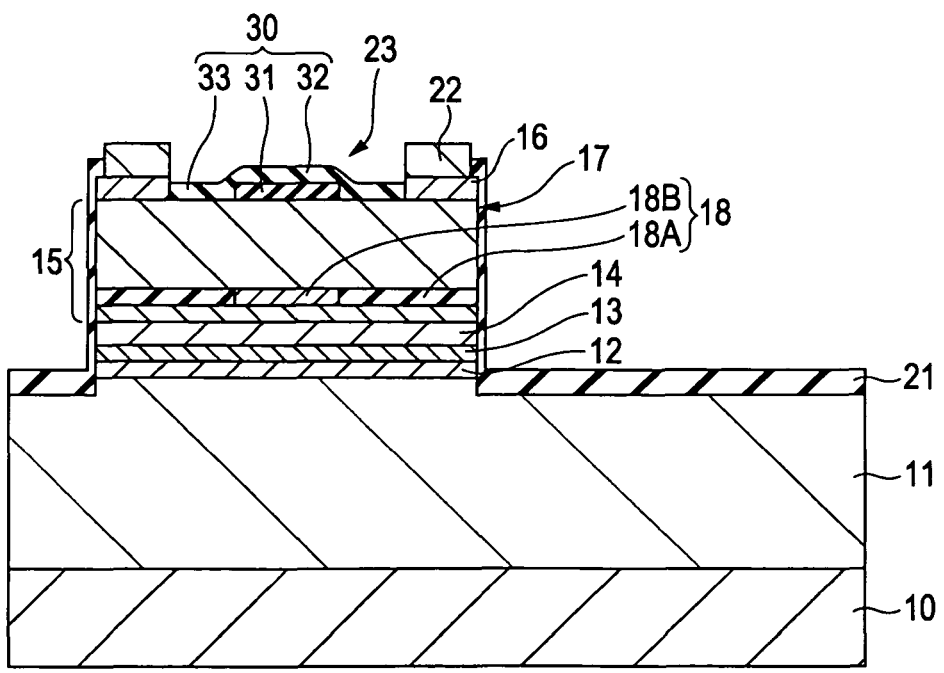

The lower DBR layer 11, the lower spacer layer 12, the active layer 13, the upper spacer layer 14, the upper DBR layer 15, and the contact layer 16 are first laminated on the substrate 10 in this order (see FIG. 7A). In this case, the oxidization layer 18D is formed in a predetermined portion of the upper DBR layer 15. The oxidation layer 18D is a layer which is subjected to an oxidation process, which is described below, to become the current narrowing layer 18, and is formed of p-type AlAs.

An Al composition value (e, f) of the low refractive index layer and the high refractive index layer in the lower DBR layer 11, an Al composition value (p, q) of the low refractive index layer 15A and the high refractive index layer 15B in the upper DBR layer 15, and an Al composition value (r) of the unoxidized region 18B in the current narrowing layer 18 satisfy the following relational expression, 1≥r>(e, p)>0.8>(f, q)>0.45, where (e, p) means e or p and (f, q) means f or q.

Next, a resist layer (not shown) is formed on the entire surface, and then the resist layer remains only in the portion corresponding to the surface of the mesa portion 17. Subsequently, the mesa portion 17 is formed by selectively etching a part of the lower spacer layer 12, the active layer 13, the upper spacer layer 14, the upper DBR layer 15, and the contact layer 16 (see FIG. 7B). Subsequently, the resist layer is removed.

Subsequently, an oxidization process is performed at high temperature in a water-vapor atmosphere to selectively oxidize Al of the oxidization layer 18D from the outside of the mesa portion 17. In this way, the outer circumferential region of the oxidization layer 18D becomes an insulting layer (oxidized aluminum). That is, the circular circumferential region of the oxidization layer becomes the oxidized region 18A and the central region of the oxidization layer becomes the unoxidized region 18B which is a current injection region (see FIG. 8A).

Subsequently, the above-mentioned metal materials are laminated on the entire surface by a vacuum vapor deposition method, for example, and then the circular upper electrode 22 is formed on the surface of the mesa portion 17 by selective etching, for example. Subsequently, a resist layer (not shown) is formed on the entire surface, and then an opening is formed at the portion corresponding to the opening of the upper electrode 22. Subsequently, the contact layer 16 is selectively etched to form an opening in the contact layer 16. In this way, the light-emitting opening 23 is formed (see FIG. 8B). Subsequently, the resist layer is removed.

Subsequently, the above-mentioned dielectric material (thickness: an odd number time of ($\lambda/4$)) is stacked on the entire surface by a CVD (Chemical Vapor Deposition), for example. Subsequently, the portions other than the portion corresponding to the central region of the light-emitting opening 23 are selectively etched to form the first adjusting layer 31 (see FIG. 9A). Subsequently, the above-mentioned dielectric material (thickness: an odd number multiple of ($\lambda/4$)) is stacked on the entire surface by the above method, and then the dielectric material is selectively etched. In this way, the surface of the upper electrode 22 is exposed and the second adjusting layer 32, the third adjusting layer 33, and the protective film 21 are formed together (see FIG. 9B).

Subsequently, the above-mentioned metal materials are laminated on the entire surface by a vacuum vapor deposition method, for example, and then the electrode pad 24 is formed on the circumference of the mesa portion 17 by selective etching, for example. Subsequently, the rear surface of the substrate 10 is polished and etched so as to form the substrate 10 with a thickness of 100 µm. Finally, the lower electrode 25 is formed on the rear surface of the substrate 10. In this way, the semiconductor laser 1 is manufactured according to this embodiment.

3. Operation Effect

In the semiconductor laser 1 having such a configuration, when a predetermined voltage is applied between the upper electrode 22 and the lower electrode 25, current is injected into the active layer 13 through the unoxidized region 18B of the current narrowing layer 18, and thus light is emitted by the re-combination of electrons and holes. This light is reflected from a pair of the lower DBR layer 11 and the upper DBR layer 15, and then emits as a laser beam by occurrence of laser oscillation of a predetermined wavelength $\lambda$.

In this embodiment, the AlxGayIn1-x-yP (where 0≤x<1 and 0<y<1) based active layer 13 is disposed in the semiconductor laser 1. That is, the active layer 13 is formed of the material generating light of a red band with a wavelength shorter than that of an infrared band. The semiconductor laser 1 includes the current narrowing layer 18 which includes the unoxidized region 18B in the in-plane central region and the circular oxidized region 18A in the circumference of the unoxidized region 18B. There is provided the lateral mode adjusting layer 30 which includes the high reflection region 23A so as to correspond to the unoxidized region 18B and the circular low reflection region 23B in the circumference of the high reflection region 23A. Moreover, the diameters $D_{ox}$ and $D_{hr}$ satisfy above Expression (1). In this way, the index guide structure of which the equivalent refractive index distribution of the waveguide is weak can be realized. In this embodiment, for example, the current narrowing layer 18 is formed at the position (the node of the standing wave) distant by $(7/4+(n/2))\lambda$ from the active layer (the center of the active layer 13 in the thickness direction thereof). In this way, it is possible to realize the weak index guide structure.

As a consequence, since wattless current can be reduced, compared to a case where the refractive index distribution is realized as a gain guide structure, a low threshold value can be achieved. Moreover, the lateral mode can be controlled by broad current narrowing, a high output single mode oscillation can be achieved. In this embodiment, since it is not necessary to use a special structure or a special process, the laser oscillation of the single mode can be achieved with the simple and plain structure. Accordingly, in this embodiment, a high output single mode oscillation can be achieved with the simple and plain structure and with the current of a low threshold value.

In this embodiment, when the current narrowing layer is formed at the position which is away from the active layer 13, the cavity length $L_1$ may be set to $(1/2)\lambda$ and the current narrowing layer 18 may be disposed in the upper DBR layer 15 so as to be relatively close to the light-emitting opening 23. Alternatively, in a state where the current narrowing layer 18 is fixed to the position in the upper DBR layer 15, the cavity length $L_1$ on the side of the upper DBR layer 15 in the lamination structure 20 may be longer than $(1/2)\lambda$. In the latter case, occurrence of the carrier overflow can be reduced, compared to the case where the cavity length $L_1$ may be set to $(1/2)\lambda$. As a consequence, the temperature characteristic can further be improved.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser comprising:
a columnar lamination structure including a first multi-layer reflection mirror, a lower spacer layer, an $Al_xGa_yIn_{1-x-y}P$ (where $0 \leq x<1$ and $0<y<1$) based active layer, an upper spacer layer, a second multi-layer reflection mirror, and a lateral mode adjusting layer on a substrate in this order from the substrate and including a current narrowing layer,
wherein the current narrowing layer includes
an unoxidized region in an in-plane central region and
a circular oxidized region in the circumference of the unoxidized region,
wherein the lateral mode adjusting layer includes
a high reflection region to correspond to the unoxidized region and
a circular low reflection region in the circumference of the high reflection region,
wherein the high reflection region is formed by a structure in which a first adjusting layer, of which a thickness is $(2\alpha-1)\lambda/4n_1$ (where $\alpha$ is an integer equal to or larger than 1, $\lambda$ is an oscillation wavelength, and $n_1$ is a refractive index) and the refractive index $n_1$ is lower than that of the surface of the first multi-layer reflection mirror, and a second adjusting layer, of which a thickness is $(2\beta-1)\lambda/4n_2$ (where $\beta$ is an integer equal to or larger than 1 and $n_2$ is a refractive index) and the refractive index $n_2$ is higher than that of the first adjusting layer, are laminated in this order,
wherein the low reflection region is formed by a third adjusting layer of which a thickness is $(2\gamma-1)\lambda/4n_3$ (where $\gamma$ is an integer equal to or larger than 1 and $n_3$ is a refractive index) and the refractive index $n_3$ is higher than that of the first adjusting layer, and
wherein the second multi-layer reflection mirror is formed by alternately laminating a low refractive index layer and a high refractive index layer, the uppermost layer of the second multi-layer reflection mirror is a high refractive index layer and the lowermost layer of the second multi-layer reflection mirror is a high refractive index layer, and the current narrowing layer is formed in a low refractive index layer of the second multi-layer reflection mirror.

2. The semiconductor laser according to claim 1, wherein the active layer has a quantum well structure formed by alternately laminating well layers mainly containing $Al_aGa_bIn_{1-a-b}P$ (where $0 \leq a<1$ and $0<b<1$) and barrier layers mainly containing $Al_cGa_dIn_{1-c-d}$ (where $0<c<1$ and $0<d<1$).

3. The semiconductor laser according to claim 1, wherein the current narrowing layer is formed at a position distant from the active layer by $(7/4+(n/2))\lambda$ (where n is an integer equal to or larger than 0).

4. The semiconductor laser according to claim 3, wherein the current narrowing layer is formed in the second multi-layer reflection mirror.

5. The semiconductor laser according to claim 1, wherein the first adjusting layer is formed of an oxide material and the second and third adjusting layers are formed of a nitride material.

* * * * *